(12) United States Patent
Park et al.

(10) Patent No.: US 6,172,921 B1
(45) Date of Patent: Jan. 9, 2001

(54) COLUMN REDUNDANCY CIRCUIT FOR SEMICONDUCTOR MEMORY

(76) Inventors: San Ha Park, Samil Apt. 104-503. Uncheong-Dong, Hunguk-Ku, Cheongju, Choongcheongbuk-Do (KR); Ju Han Kim, Dongsin Apt. 213-808, 589, Jungja-Dong, Jangan-Ku, Suwon, Kyungki-Do (KR); Hong Beom Pyeon, Samsung Apt. 104-601, Yulyang-Dong, Sangdang-Ku, Cheongju, Choongcheongbuk-Do (KR)

( * ) Notice: Under 35 U.S.C. 154(b), the term of this patent shall be extended for 0 days.

(21) Appl. No.: 09/426,725

(22) Filed: Oct. 26, 1999

(30) Foreign Application Priority Data

May 27, 1999 (KR) .................................................. 99-19239

(51) Int. Cl.[7] .................................................. G11C 29/00
(52) U.S. Cl. .......................... 365/200; 365/207; 365/205
(58) Field of Search ................................... 365/200, 205, 365/207, 208

(56) References Cited

U.S. PATENT DOCUMENTS 5,452,258 * 9/1995 Hotta .................................... 365/200
5,495,445 * 2/1996 Proebsting ........................... 365/200

* cited by examiner

Primary Examiner—Vu A. Le

(57) ABSTRACT

The present invention relates to a column redundancy circuit for a semiconductor memory which can facilitate a high integration semiconductor circuit whose memory array is divided into a plurality of array units to be properly operated at a high frequency. The plurality of array units in the memory array include a plurality of normal memory cells and a plurality of redundancy memory cells. The redundancy data stored in the redundancy memory cells are outputted to a first main amplifier, and the normal data stored in the normal memory cells are outputted to a second main amplifier. A column redundancy unit outputs a redundancy enable signal according to a column address, a row address and a fuse short state. According to the logical state of the redundancy enable signal, the switch unit selects the redundancy data from the first main amplifier or the normal data from the second amplifier, and outputs it to a data output buffer.

22 Claims, 8 Drawing Sheets

COLUMN REDUNDANCY CIRCUIT FOR SEMICONDUCTOR MEMORY

BACKGROUND OF THE INVENTION

1. Field of the Invention

The present invention relates to a column redundancy circuit for a semiconductor memory, and in particular to a column redundancy circuit for a semiconductor memory which can facilitate a high integration semiconductor circuit whose memory array is divided into a plurality of array units to be properly operated at a high frequency, by selecting and outputting one of a normal data and a redundancy data which are outputted from the memory array, according to a row address and a column address.

2. Description of the Background Art

A column redundancy circuit using a column address and a redundancy circuit by inputs and outputs have been known as conventional column redundancy circuits.

FIG. 1 is a block diagram illustrating the conventional column redundancy circuit using the column address.

A clock buffer 1 buffers an external clock signal EX_CLK, and outputs it to a pulse width control unit 5. An address buffer 2 buffers an external address EX_ADD, and outputs it to a column redundancy unit 4 and a column predecoder 6. In a burst mode, an address counter 3 counts the buffered external address EX_ADD, and outputs an internal address IN_ADD to the column redundancy unit 4 and the column predecoder 6. The column redundancy unit 4 determines whether to repair each memory array unit according to the external address EX_ADD and the internal address IN_ADD to be inputted to the column redundancy unit 4, and outputs corresponding redundancy information RE_INF.

The pulse width control unit 5 serves to output to the column predecoder 6 the internal clock signal IN_CLK for determining a pulse width of a column selecting signal according to the buffered external clock signal EX_CLK, and to output to a column decoder 7 a redundancy clock signal CLK_RE_INF having the redundancy information RE_INF.

The column predecoder 6 enables a normal address path in a non-redundancy mode where a repair operation is not performed. To the contrary, the column predecoder 6 disables the normal address path in a redundancy mode where the repair operation is carried out, predecodes a column address Y_ADD from the address buffer 2, and outputs it to the column decoder 7. A pulse width of the predecoded column address Y_ADD is determined by the external clock signal EX_CLK.

The column decoder 7 determines whether to repair according to the redundancy clock signal CLK_RE_INF, and outputs a normal column selecting signal NYS or a redundancy column selecting signal RYS to a memory array 8. That is, the column decoder 7 outputs the normal column selecting signal NYS in the non-redundancy mode, and outputs the redundancy column selecting signal RYS in the redundancy mode. Here, the normal column selecting signal NYS and the redundancy column selecting signal RYS are signals for selecting a sense amplifier (not shown) in the memory array 8.

The memory array 8 consists of a plurality of normal memory cells and a plurality of redundancy memory cells. When the column decoder 7 outputs the normal column selecting signal NYS, the data stored in the normal memory cells of the memory array are read. In case the column decoder 7 outputs the redundancy column selecting signal RYS, the data stored in the redundancy memory cells of the memory array 8 are read. The data which have been read are inputted to a main amplifier 9 via an input/output line LIOT/B, amplified and outputted to an output buffer (not shown).

FIGS. 2a and 2b are timing views of the circuit in FIG. 1. FIG. 2a is a timing view in the non-redundancy mode, and FIG. 2b is a timing view in the redundancy mode. As shown therein, in a state where the external clock signal EX_CLK is inputted, if a column address strobe signal CAS is inputted, the external address EX_ADD and the internal address IN_ADD are transited. When a first predetermined time t1 lapses after the internal address IN_ADD is transited, the redundancy information RE_INF is at a high level, and the redundancy clock signal IN_CLK is also at a high level. As shown in FIG. 2a, what the redundancy clock signal IN_CLK is at a high level implies that the column redundancy circuit is operated in the non-redundancy mode. In FIG. 2b, what the redundancy clock signal IN_CLK is at a high level means that the column redundancy circuit is operated in the redundancy mode.

When a second predetermined time t2 lapses after the first predetermined time t1, the normal column selecting signal NYS is enabled in the normal mode, as shown in FIG. 2a, and the redundancy column selecting signal RYS is enabled in the redundancy mode, as depicted in FIG. 2b.

The second predetermined time t2 is a time taken to determine whether the column predecoder 6 and the column decoder 7 operate the column redundancy circuit in the normal mode or the redundancy mode, according to whether to repair, and is identical in the normal mode and the redundancy mode.

The second predetermined time t2 is clearly longer than when the normal column selecting signal NYS is outputted without determining whether to repair. As the second predetermined time t2 becomes longer, a whole processing speed of the column redundancy circuit is delayed.

In order to overcome such a disadvantage, there is provided the redundancy circuit by inputs and outputs.

FIG. 3 is a block diagram illustrating the conventional redundancy circuit by inputs and outputs. As shown therein, the clock buffer 1, the address buffer 2 and the address counter 3 are identical in constitution and operation to those in FIG. 1. A pulse width control unit 31 outputs to a column predecoder 32 an internal clock signal IN_CLK for determining a pulse width of a column selecting signal according to a buffered external clock signal EX_CLK. An externally-inputted column address Y_ADD is inputted to a column decoder 33 via the address buffer 2 and the column predecoder 32. The column decoder 33 outputs a column selecting signal YS to the memory array 34. Here, the column address Y_ADD and the column selecting signal YS do not relate to a repair operation. The memory array 34 includes normal memory cells and redundancy memory cells. Each array is not divided into a plurality of array units, differently from the memory array 8 as illustrated in FIG. 1. The data stored in the normal array cells are inputted to a main amplifier 35 through a normal input/output line NLIOT/B, and the data stored in the redundancy memory cells are inputted to the main amplifier 35 via a redundancy input/output line RLIOT/B.

The column redundancy unit 36 determines whether to repair the normal input/output line NLIOT/B and the redundancy input/output line RLIOT/B, and outputs redundancy information RE_INF to the main amplifier 35. According to the redundancy information RE_INF, the main amplifier 35 amplifies and outputs one of the data inputted to the normal input/output line NLIOT/B and the redundancy input/output line RLIOT/B.

As described above, in the circuit as shown in FIG. 3, when the column selecting signal YS (identical to the normal column selecting signal NYS as shown in FIG. 1) is outputted to the memory array 34, whether to repair is not determined, differently from the circuit as shown in FIG. 1. Accordingly, an extra time to determine whether to repair is not necessary. As a result, the circuit in FIG. 3 is faster in operation than the circuit in FIG. 1. However, the memory array is not divided, and thus redundancy efficiency is reduced. In addition, as the memory array is divided into a plurality of array units, and thus the number of the array units is increased, a load of the redundancy input/output line RLIOT/B is also increased. Accordingly, in order to employ such a circuit, the number of the array units must be limited. Thus, it is not suitable for a high integration circuit where the memory array is divided into many array units.

SUMMARY OF THE INVENTION

It is therefore an object of the present invention to provide a column redundancy circuit for a semiconductor memory which can improve an operational speed of a high integration semiconductor circuit whose memory array is divided into a plurality of memory array units.

In order to achieve the above-described object of the present invention, there is provided a column redundancy circuit for a semiconductor memory including: a memory array consisting of a plurality of array units respectively having a plurality of normal memory cells and a plurality of redundancy memory cells, each array unit outputting a normal data stored in the normal memory cell, and outputting a redundancy data stored in the redundancy memory cell; a first main amplifier amplifying the redundancy data; a second main amplifier amplifying the normal data; a column redundancy unit outputting a redundancy enable signal according to a column address, a row address and a fuse short state; and a switch unit selecting and outputting one of the redundancy data amplified in the first main amplifier or the normal data amplified in the second main amplifier.

BRIEF DESCRIPTION OF THE DRAWINGS

The present invention will become better understood with reference to the accompanying drawings which are given only by way of illustration and thus are not limitative of the present invention, wherein:

FIGS. 2a and 2b are timing views of the circuit in FIG. 1, wherein:

FIG. 2a is a timing view in a non-redundancy mode; and

FIG. 2b is a timing view in a redundancy mode;

FIGS. 7a and 7b are timing views of the circuit in FIG. 4, wherein:

FIG. 7a is a timing view in a non-redundancy mode; and

FIG. 7b is a timing view in a redundancy mode.

DETAILED DESCRIPTION OF THE INVENTION

A column redundancy circuit for a semiconductor memory in accordance with the present invention will now be described with reference to the accompanying drawings.

Figure 1:
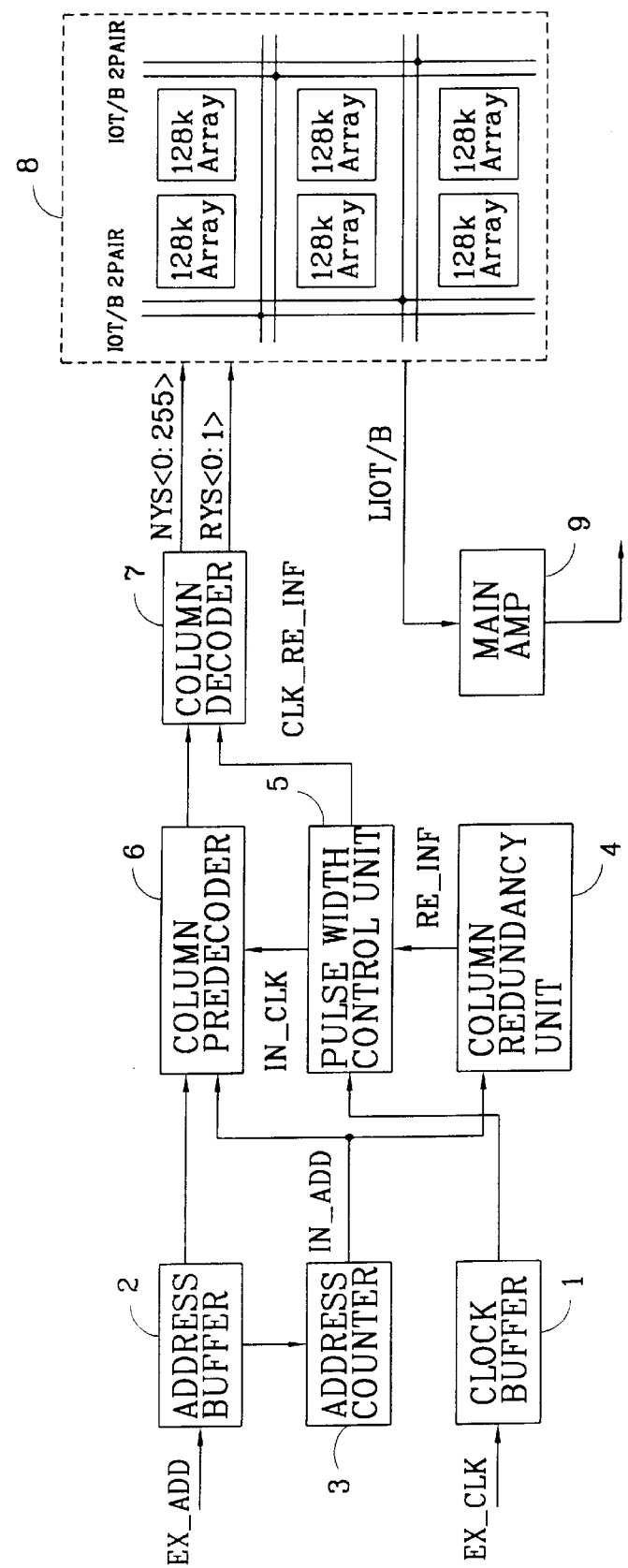
FIG. 1 is a block diagram illustrating a conventional column redundancy circuit employing a column address of a semiconductor memory.
Figure 4:
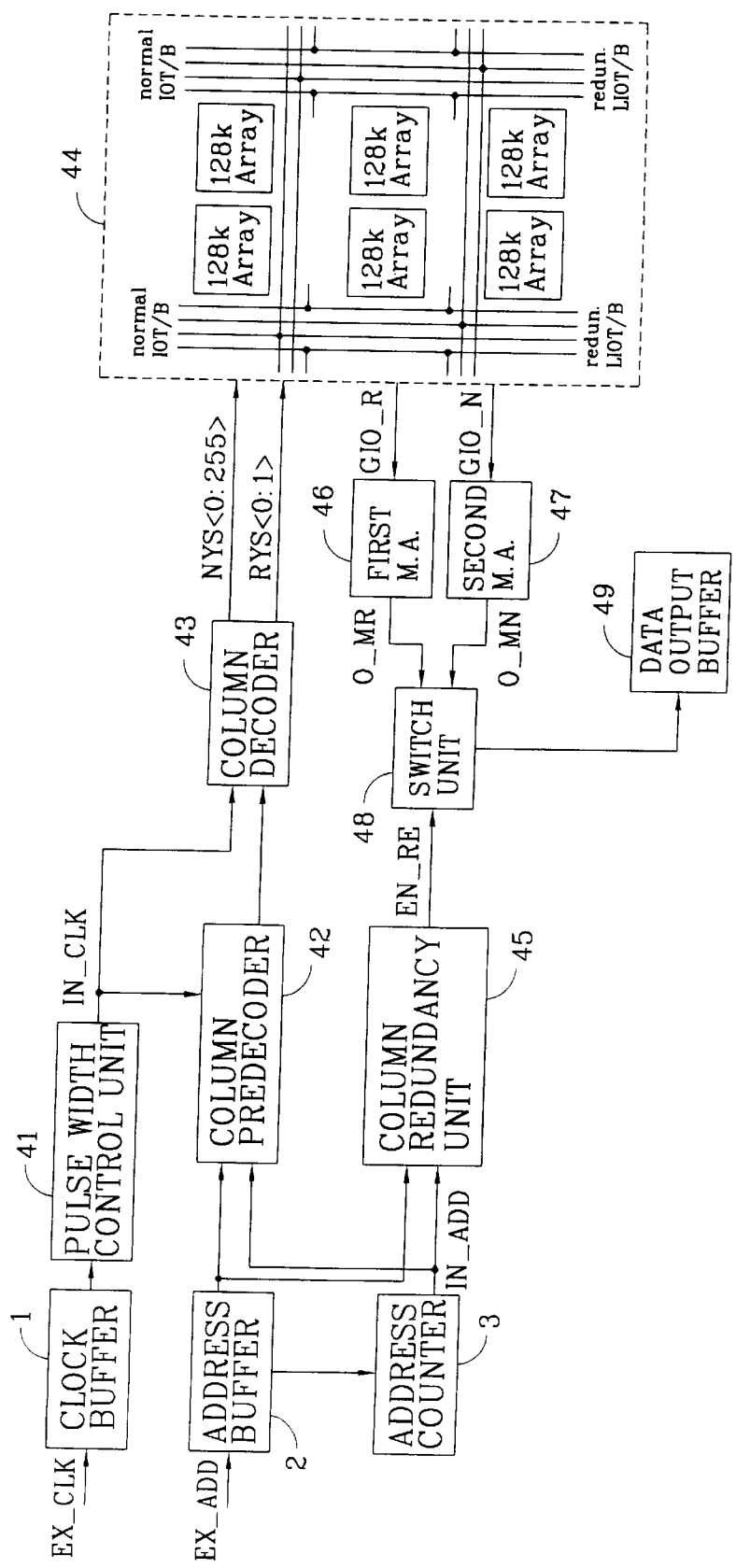
FIG. 4 is a block diagram illustrating a column redundancy circuit employing a column address of a semiconductor memory in accordance with a preferable embodiment of the present invention.

FIG. 4 is a block diagram illustrating the column redundancy circuit using a column address of the semiconductor memory in accordance with a preferable embodiment of the present invention. A clock buffer 1, an address buffer 2 and an address counter 3 as shown in FIG. 4 are identical in constitution and operation to those as shown in FIG. 1, and thus explanation thereof is omitted.

A pulse width control unit 41 outputs an internal clock signal IN_CLK for controlling a pulse width of a column selecting signal to a column predecoder 42 and a column decoder 43 according to an external clock signal EX_CLK buffered in the clock buffer 1. A column decoder 43 receives a predecoded column address and the internal clock signal IN_CLK, and outputs a normal column selecting signal NYS and a redundancy column selecting signal RYS to a memory array 44, regardless of whether to repair.

The memory array 44 includes a plurality of normal memory cells and a plurality of redundancy memory cells. In more detail, referring to FIG. 5, the memory array 44 consists of a plurality of array units 441–446. Each array unit 441–446 includes the plurality of normal memory cells and the plurality of redundancy memory cells (not shown). In addition, each array unit 441–446 is connected to local normal input/output lines LIO_N and local redundancy input/output lines LIO_R. The plurality of normal input/output lines LIO_N are connected to a global normal input/output line GIO_N, and the plurality of local redundancy input/output line LIO_R are connected to a global redundancy input/output line GIO_R.

The redundancy data stored in the redundancy memory cells by the redundancy column selecting signal RYS from the column decoder 43 are outputted to a first main amplifier 46 through the local redundancy input/output line LIO/R and the global redundancy input/output line GIO_R. The normal data stored in the normal memory cells by the normal column selecting signal NYS from the column decoder 43 are outputted to a second main amplifier 47 through the local redundancy input/output line LIO/N and the global redundancy input/output line GIO_N.

The first main amplifier 46 amplifies the inputted redundancy data, and outputs it to a switch unit 48, and the second main amplifier 47 amplifies the inputted normal data, and outputs it to the switch unit 48. The first main amplifier 46 includes four amp units MR1–MR4 which are connected to the global redundancy input/output line GIO_R, respectively. The second main amplifier 47 includes four amp units MN1–MN4 which are connected to the global normal input/output line GIO_N.

A column redundancy unit 45 receives the external address and the internal address, determines whether to repair, and outputs a redundancy enable signal EN_RE to the switch unit 48. In more detail, referring to FIG. 6, the column redundancy unit 45 includes a plurality of enable units 450–457 outputting a column address true signal Y_ADDT or a column address bar signal Y_ADDB according to row addresses X_ADD0, X_ADD1 and fuse states F0, F1; and a combination unit 460 combining signals outputted from the plurality of enable units 450–457, and outputting the redundancy enable signal EN_RE to the switch unit 48.

Figure 6:
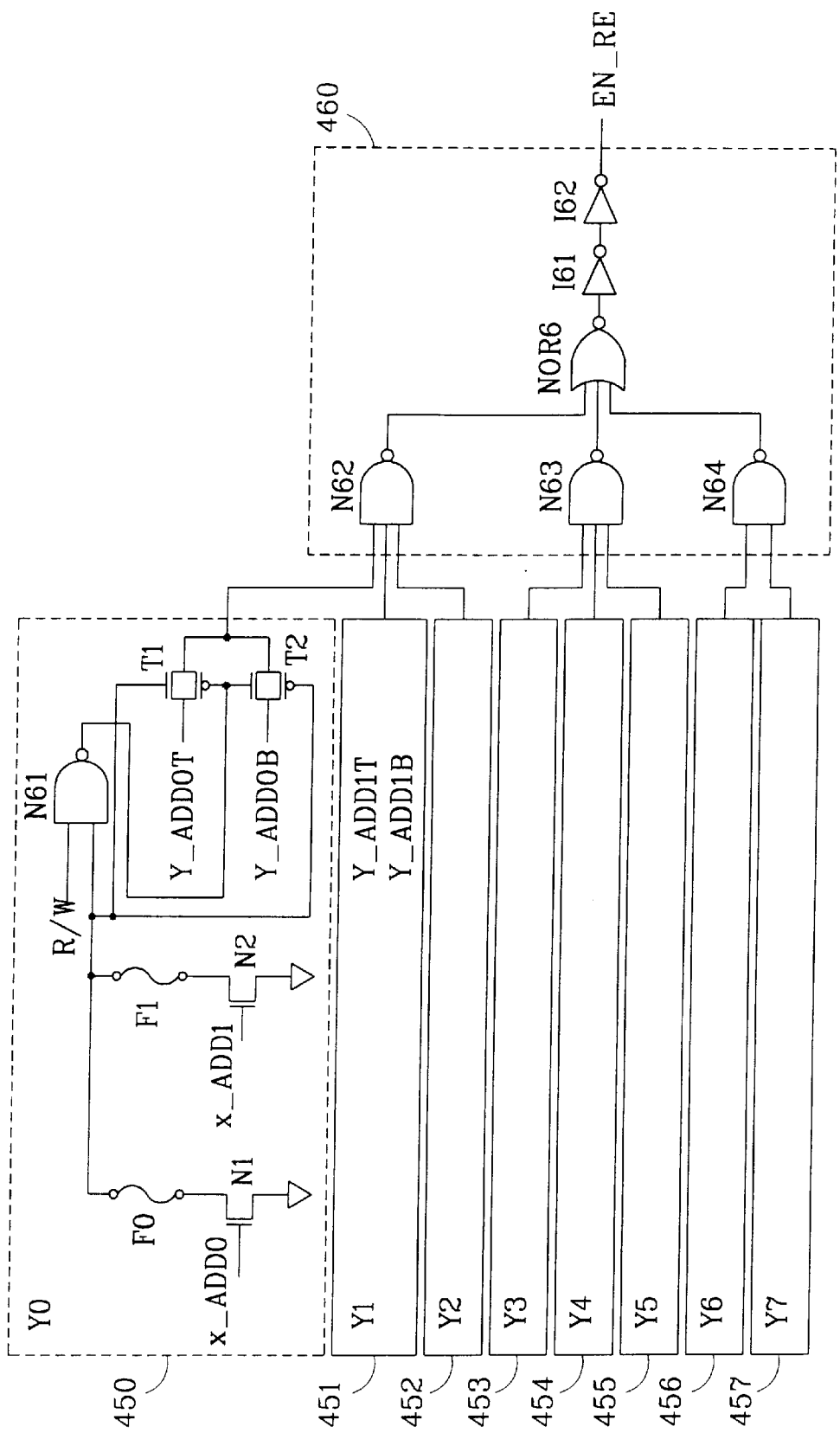
FIG. 6 is a detailed circuit view illustrating a column redundancy unit in the configuration of FIG. 4.

The number of the plurality of enable units 450–457 is identical to that of the column addresses. A first enable unit 450 includes: a NAND gate N61 receiving a read/write enable signal R/W at its one-side input terminal; a plurality of fuses F0, F1; a plurality of switching transistors N1, N2 having their gate connected to receive row addresses X_ADD0, X_ADD1, and being connected to the other input terminal of the NAND gate N61 through the fuses F0, F1; and two transmission gates T1, T2. On the other hand, FIG. 6 illustrates two fuses F0, F1 and two switching transistors N1, N2 for convenience. However, the entire number thereof is identical to the number of the row addresses.

The two transmission gates T1, T2 are turned on/off according to a level of an output signal from the NAND gate N61 and a level of the other side input terminal thereof. A first column address true signal Y_ADD0T is passed through the first transmission gate T1, and a first column address bar signal Y_ADD0B is passed through the second transmission gate T2. The first transmission gate T1 and the second transmission gate T2 have a complementary relationship. That is, when the first column address true signal Y_ADD0T is passed, the first column address bar signal Y_ADD0B is interrupted. Also, in case the first column address bar signal Y_ADD0B is passed, the first column address true signal Y_ADD0T is interrupted. The other enable units 451–457 are identical in constitution to the first enable unit 450. However, each enable unit 451–457 outputs different address signals. For instance, the second enable unit 451 selectively outputs a second column address true signal Y_ADD1T or a second column address bar signal Y_ADD1B.

The operation of the first enable unit 450 will now be explained. It is presumed that the read/write enable signal R/W is enabled, that is the input terminal at the one side of the first NAND gate N61 is at a high level.

The plurality of row addresses X_ADD0, X_ADD1 which are inputted from the address buffer 2 are sequentially coded. After a first row address X_ADD0 is coded, a second row address X_ADD1 is coded. In case the first row address X_ADD0 is coded, the first switching transistor N1 is turned on. In this state, if the first fuse F0 is disconnected, the terminal at the other side of the first NAND gate N61 is at a high level. To the contrary, if the first fuse F0 is connected, the terminal at the other side of the first NAND gate N61 is at a low level.

In the case that the first fuse F0 is disconnected, namely when it is presumed that the terminal at the other side of the NAND gate N61 is at a high level, the NAND gate N61 outputs a low-level signal. As a result, the first transmission gate T1 is turned on, and thus the column address true signal Y_ADD0T is passed therethrough. To the contrary, when the first fuse F0 is not disconnected, namely when the terminal at the other side of the NAND gate NAND61 is at a low level, the first transmission gate T1 is turned off, the second transmission gate T2 is turned on, and thus the column address bar signal Y_ADD0B is passed therethrough.

As described above, the first enable unit 450 outputs the first column address true signal Y_ADD0T or the first column address bar signal Y_ADD0B according to whether the fuse is connected or disconnected.

In addition, the second enable unit 451 outputs the second column address true signal Y_ADD1T or the second column address bar signal Y_ADD1B according to a fuse (not shown) is connected or disconnected.

The eight enable units 450–457 respectively selectively output the first to eighth column address true signals Y_ADD0T or the first to eighth column address bar signals Y_ADD0B according to the first address signal X_ADD0 to be coded.

When the column address true signals Y_ADD0T–Y_ADD7T or the column address bar signals Y_ADD0B–Y_ADD7B outputted from the plurality of enable units 450–457 are all at a high level, the combination unit 460 outputs the redundancy enable signal EN_RE having a high level to the switch unit 46. For this, the combination unit 460 includes: NAND gates N62, N63, N64 NANDing a predetermined number of output signals among the output signals from the enable units 450–457, respectively; a NOR gate NOR6 NORing output signals from the NAND gates N62, N63, N64; and two inverters I61, I62 buffering a level of the output signal from the NOR gate NOR6, and outputting the redundancy enable signal EN_RE.

The signals outputted from the first to third enable units 450–452 are NANDed in the second NAND gate N62. The signals outputted from the fourth to sixth enable units 453–455 are NANDed in the third NAND gate N63, and the signals outputted from the seventh and eight enable units 456, 457 are NANDed in the fourth NAND gate N64. On the other hand, according to the present invention, the address signals respectively outputted from the eight enable units 450–457 are NANDED in the three NAND gates N62–N64. However, the number of the NAND gates may be changed, if necessary.

The signals outputted from the second to fourth NAND gates N62–N64 are combined in the NOR gate NOR6, and the levels thereof are converted in the two inverters I61, I62. Accordingly, the signals are outputted to the switch unit 48 as the redundancy enable signal EN_RE. As described above, the combination unit 460 outputs the redundancy enable signal EN_RE at a high level when the eight address signals are all at a high level, and outputs the redundancy enable signal EN_RE at a low level when any of the eight address signals is at a low level.

Figure 5:
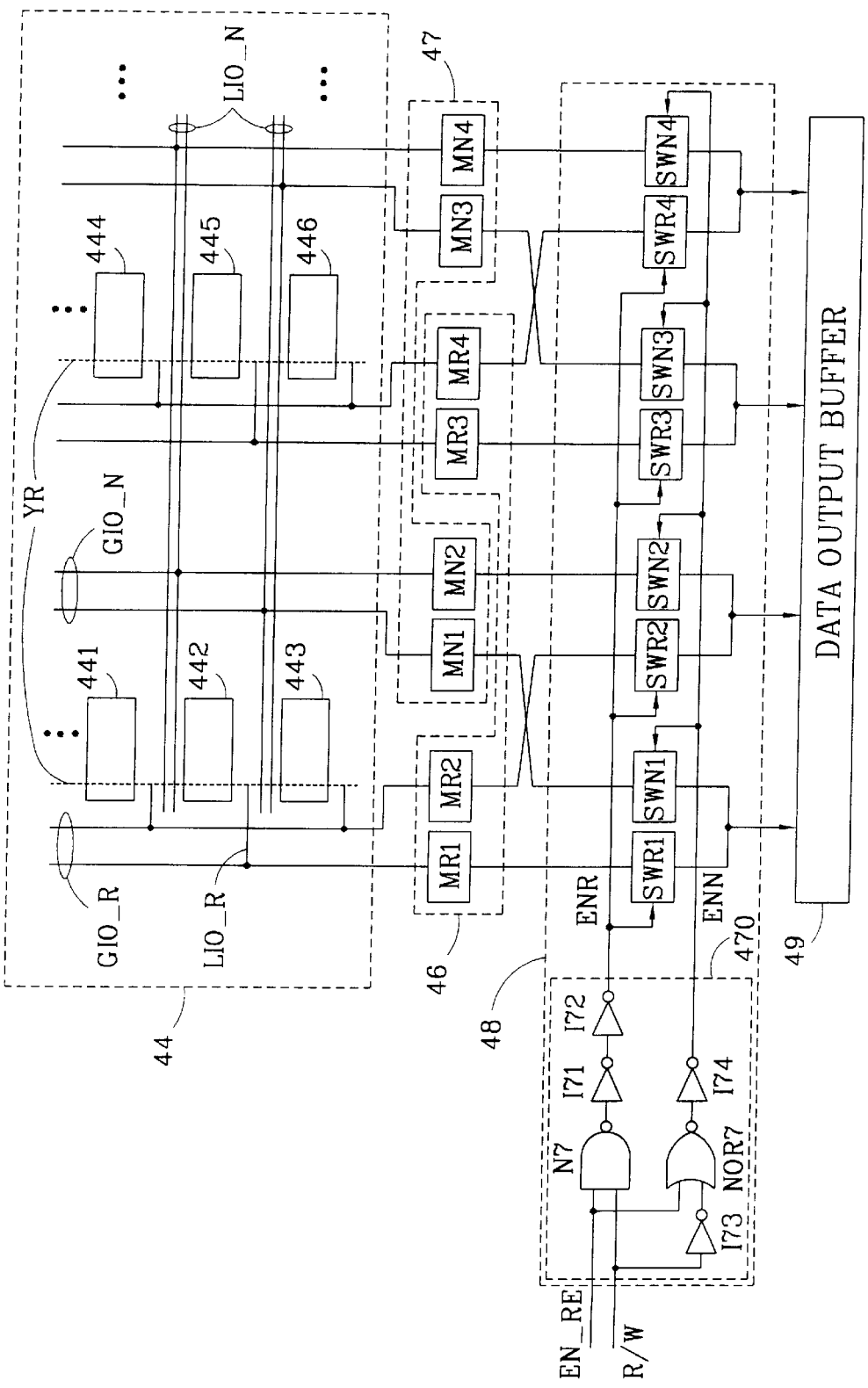
FIG. 5 is a detailed structure view illustrating a memory array, first and second main amplifiers and a switch unit in the configuration of FIG. 4.

The switch unit 48 is enabled by the read/write enable signal R/W, and outputs the redundancy data amplified in the first main amplifier 46 to a data output buffer 49, or outputs the normal data amplified in the second main amplifier 47 to the data output buffer 49, according to the redundancy enable signal EN_RE. For this, as depicted in FIG. 5, the switch unit 48 includes: a buffer unit 470 having a NAND gate N7, a NOR gate NOR7 and four inverters I71–I74, and outputting a redundancy switching signal ENR and a normal switching signal ENN; a plurality of redundancy switches SWR1–SWR4; and a plurality of normal switches SWN1–SWN4.

The plurality of redundancy switches SWR1–SWR4 are connected to the four amp units MR1–MR4 of the first main amplifier 46, switched by the redundancy switching signal ENR, and thus output the normal data amplified in the four amp units MR1–MR4 to the data output buffer 49. The plurality of normal switches SWN1–SWN4 are connected to the four amp units MN1–MN4 of the second main amplifier 47, switched by the normal switching signal ENN, and thus output the redundancy data amplified in the four amp units MN1–MN4 to the data output buffer 49.

The read/write enable signal R/W and the redundancy enable signal EN_RE from the column redundancy unit 45 are NANDed in the NAND gate N7 of the buffer unit 470. The NANDed signal is buffered in the first and second inverters I71, I72, and outputted as the redundancy switching signal ENR. In addition, the read/write enable signal R/W is inverted in the third inverter I73, and NORed with the redundancy enable signal EN_RE in the NOR gate NOR7. The output signal from the NOR gate NOR7 is inverted in the fourth inverter I74, and outputted as the normal switching signal ENN.

When the redundancy enable signal EN_RE is at a low level, the redundancy switching signal ENR becomes a high level, thereby electrically connecting the plurality of redundancy switches SWR1–SWR4. Accordingly, the redundancy data from the first main amplifier 46 is outputted to the data output buffer 49. The normal switching signal ENN becomes a low level, and thus the plurality of normal switches SWN1–SWN4 are interrupted. As a result, the normal data from the second main amplifier 47 is not transmitted to the data output buffer 49. To the contrary, when the redundancy enable signal EN_RE is at a high level, the plurality of normal switches SWN1–SWN4 are electrically connected, thereby transmitting the normal data to the data output buffer 49.

Figure 2A:
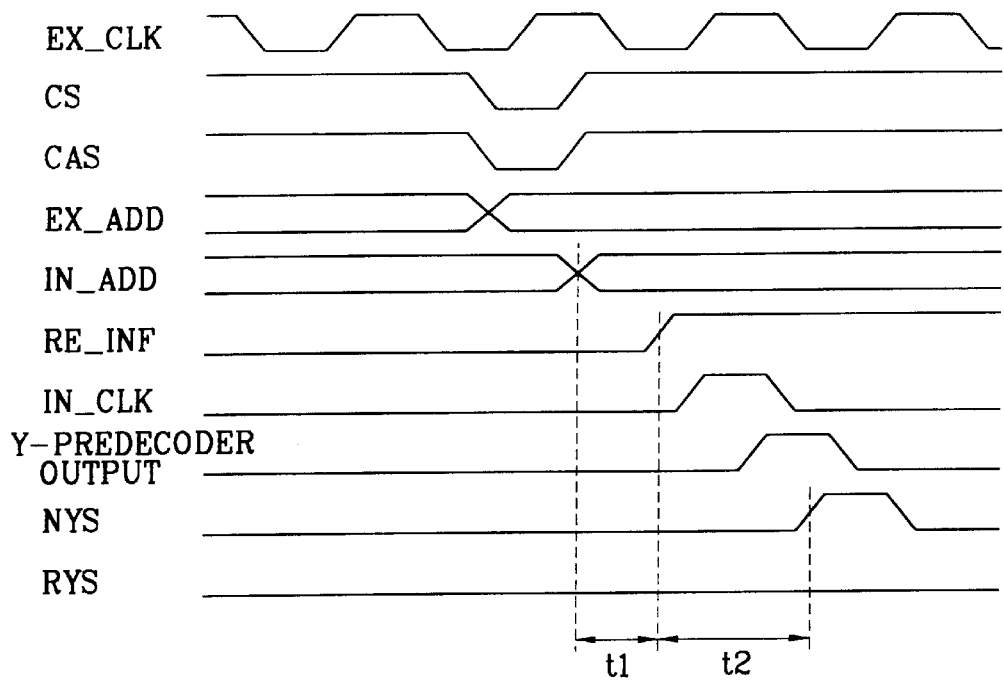
Figure 2B:
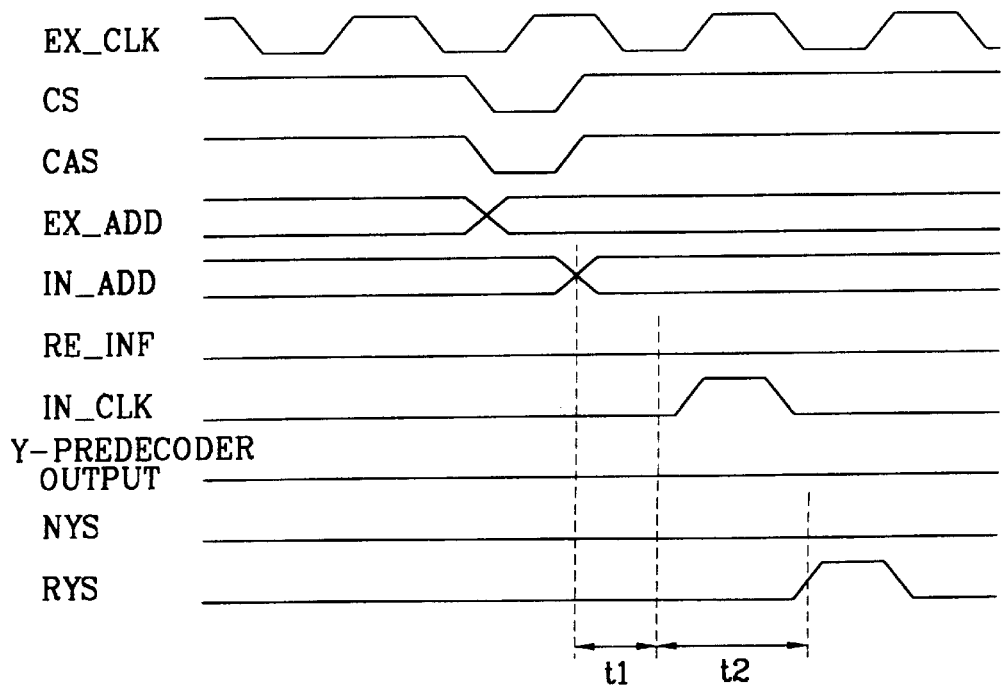
Figure 3:
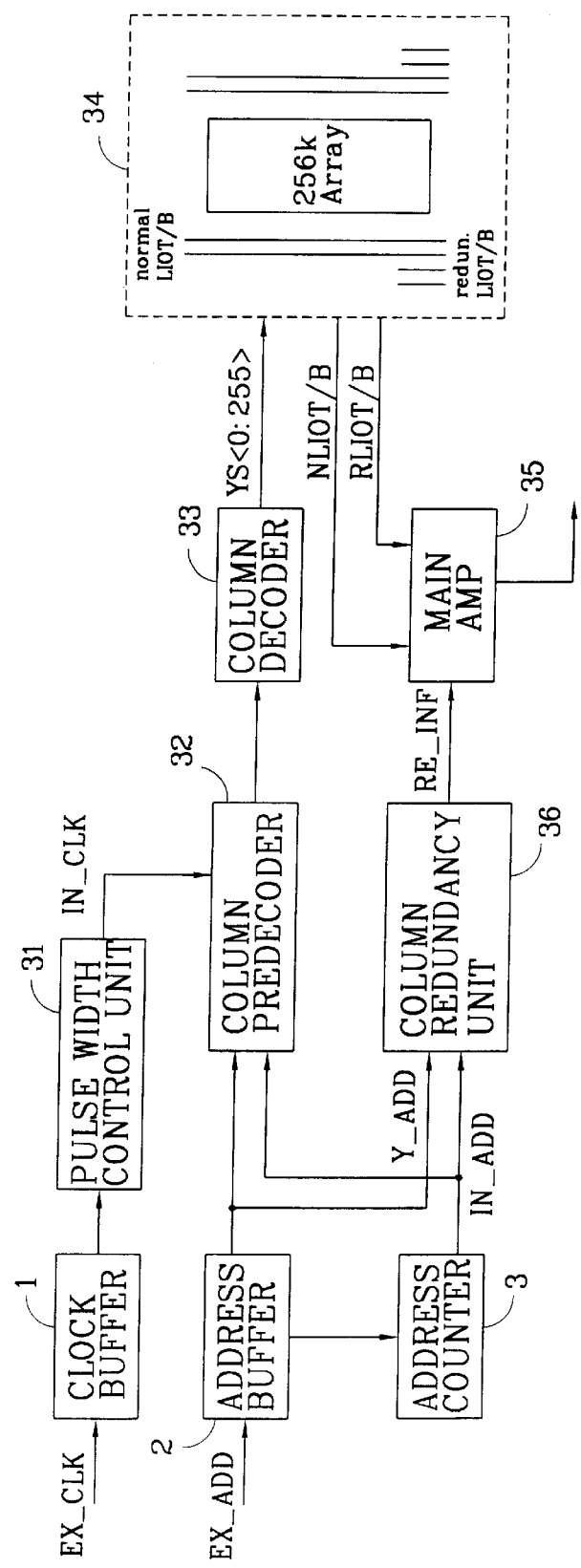
FIG. 3 is a block diagram illustrating a conventional redundancy circuit by inputs and outputs of the semiconductor memory.
Figure 7A:
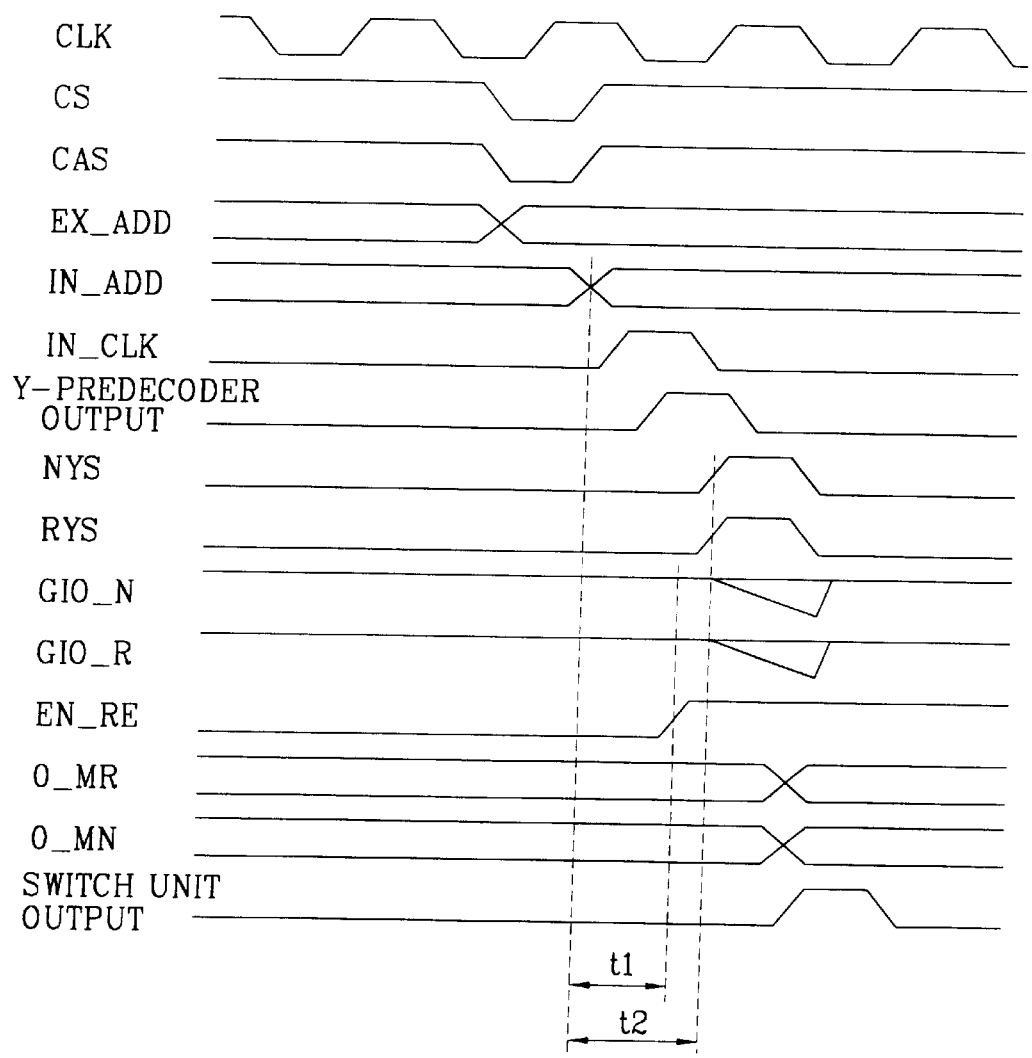
Figure 7B:
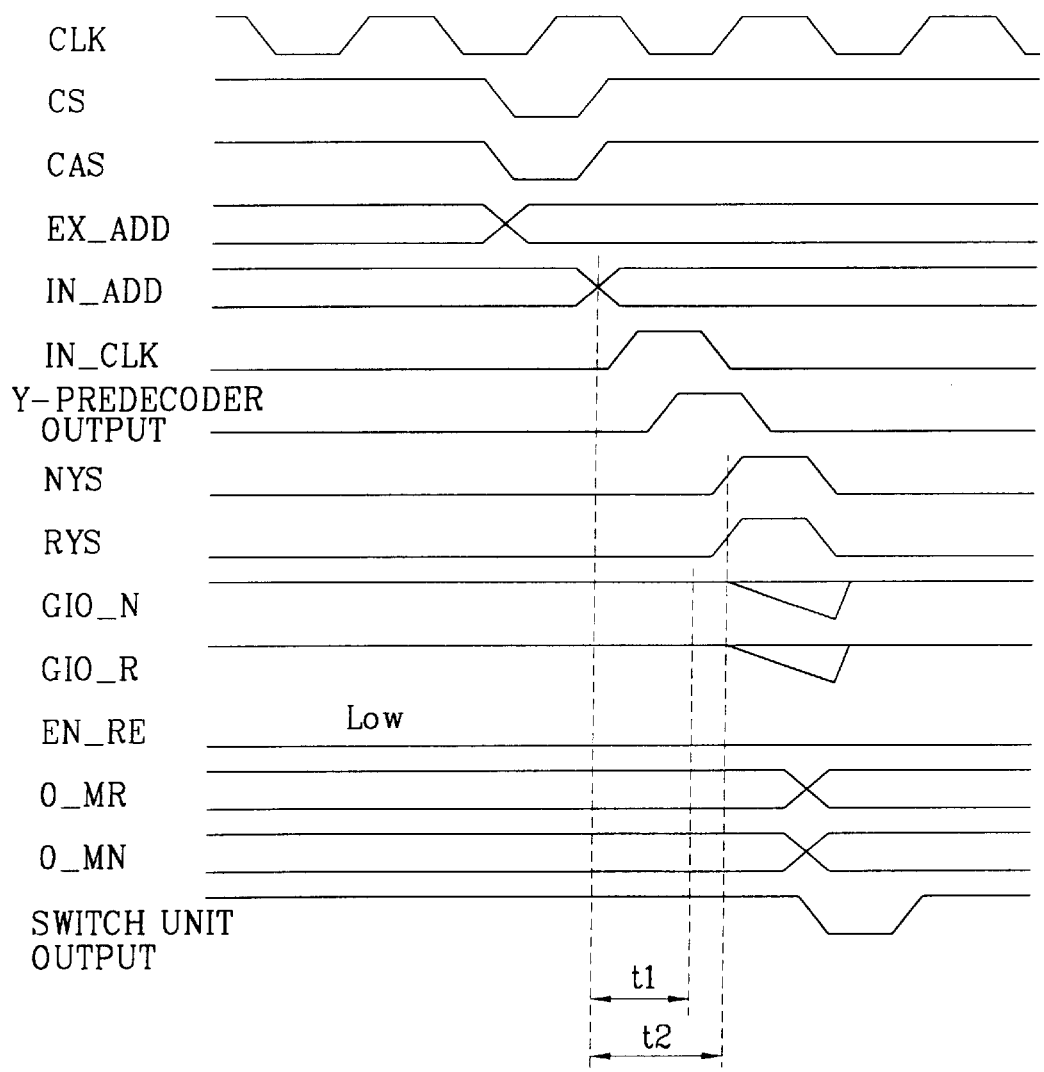

FIGS. 7a and 7b are timing views of the circuit in FIG. 4. FIG. 7a is a timing view in a non-redundancy mode, and FIG. 7b is a timing view in a redundancy mode. Referring to FIGS. 7a and 7b, the points that the external address EX_ADD and the internal address IN_ADD are transited are identical as shown in FIGS. 2a and 2b. However, referring to FIGS. 2a and 2b, the redundancy clock signal IN_CLK becomes a high level when a first predetermined time t1 lapses after the internal address IN_ADD is transited. According to the preferable embodiment of the present invention, as depicted in FIGS. 7a and 7b, the redundancy clock signal IN_CLK becomes a high level as soon as the internal address IN_ADD is transited. In the conventional art, the normal column selecting signal NYS and the redundancy column selecting signal RYS are outputted when the first predetermined time t1 and the second predetermined time t2 lapse after the internal address IN_ADD is transited. However, in accordance with the preferable embodiment of the present invention, the normal column selecting signal NYS and the redundancy column selecting signal RYS are outputted when the second predetermined time t2 lapses after the internal address IN_ADD is transited. Accordingly, the present invention reduces by the time from an internal address transition point to an output point of the redundancy clock signal having the redundancy information (the first predetermined time t1).

As discussed earlier, the column redundancy circuit in accordance with the present invention can improve speed by switching the data outputted from the memory array according to the redundancy information. In addition, in the normal mode, the normal data outputted from the memory array is amplified in the main amplifier, and in the redundancy mode, the redundancy data outputted from the memory array is amplified in the main amplifier. As a result, the present invention can be applied even when a load of the input/output line is high. Furthermore, the present invention can be also applied to a high integration semiconductor memory circuit.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A column redundancy circuit for a semiconductor memory, comprising:

a column decoder for receiving a predecoded column address and an internal clock signal, and for outputting a normal column selecting signal and a redundancy column selecting signal;

a memory array including a plurality of array units respectively having a plurality of normal memory cells and a plurality of redundancy memory cells, each array unit outputting a normal data stored in the normal memory cell according to the normal column selecting signal, and outputting a redundancy data stored in the redundancy memory cell according to the redundancy column selecting signal;

a first main amplifier for amplifying the redundancy data;

a second main amplifier for amplifying the normal data;

a column redundancy unit for outputting a redundancy enable signal according to a column address, a row address and a fuse short state; and a switch unit for selecting and outputting one of the redundancy data amplified in the first main amplifier and the normal data amplified in the second main amplifier according to a logical state of the redundancy enable signal.

2. The column redundancy circuit according to claim 1, further comprising: a pulse width control unit for outputting an internal clock signal to the column decoder in order to control a pulse width of a column selecting signal according to a buffered external clock signal.

3. The column redundancy circuit according to claim 1, wherein the memory array comprises:

a plurality of local normal input/output lines being connected to the normal memory cells;

a plurality of local redundancy input/output lines being connected to the redundancy memory cells;

a global redundancy input/output line for connecting the plurality of local redundancy input/output lines to the first main amplifier; and a global normal input/output line for connecting the plurality of local normal input/output lines to the second main amplifier.

4. The column redundancy circuit according to claim 1, wherein the column redundancy unit comprises:

a plurality of enable units for respectively outputting a column address true signal or a column address bar signal according to the row address and fuse state; and a combination unit for combining signals outputted from the plurality of enable units, and for outputting the redundancy enable signal.

5. The column redundancy circuit according to claim 4, wherein the number of the plurality of enable units is identical to the number of the column addresses.

6. The column redundancy circuit according to claim 4, wherein the plurality of enable units each respectively comprise:

a switching transistor being switched according to the row address;

a first transmission gate for outputting the column address true signal according to an ON/OFF state of the switching transistor; and a second transmission gate for outputting the column address bar signal according to the ON/OFF state of the switching transistor, the first and second transmission gates having a complementary relationship.

7. The column redundancy circuit according to claim 4, wherein the plurality of enable units each respectively comprise:
   a switching transistor being switched according to the row address;
   a NAND gate having one side input terminal connected to a read/write enable signal, and having the other side input terminal connected to the switching transistor via the fuse;
   a first transmission gate being switched according to a logical level of the other side input terminal and the output terminal of the NAND gate, and outputting the column address true signal; and
   a second transmission gate being switched according to a logical level of the other side input terminal and the output terminal of the NAND gate, and outputting the column address bar signal, the first and second transmission gates having a complementary relationship.

8. The column redundancy circuit according to claim 4, wherein the combination unit outputs the redundancy enable signal at a high level when the signals outputted from the plurality of enable units are all at a high level.

9. The column redundancy circuit according to claim 4, wherein the combination unit comprises:
   a plurality of NAND gates for NANDing signals outputted from the plurality of enable units;
   a NOR gate for NORing outputs from the plurality of NAND gates; and
   two inverters for buffering an output from the NOR gate, and for outputting the redundancy enable signal.

10. The column redundancy circuit according to claim 1, wherein the switch unit comprises:
    a buffer unit for receiving the redundancy enable signal, and for outputting a redundancy switching signal and a normal switching signal;
    a redundancy switch being switched according to the redundancy switching signal, and outputting the redundancy data from the first main amplifier; and
    a normal switch being switched according to the normal switching signal, and outputting the normal data from the second main amplifier, a logical level of the redundancy switching signal being opposite to a logical level of the normal switching signal.

11. The column redundancy circuit according to claim 10, wherein the buffer unit comprises:
    a NAND gate for NANDing the redundancy enable signal and the read/write enable signal;
    first and second inverters for buffering an output from the NAND gate, and for outputting the redundancy switching signal;
    a third inverter for inverting the read/write enable signal;
    a NOR gate for NORing an output from the third inverter and the redundancy enable signal; and
    a fourth inverter for inverting an output from the NOR gate, and for outputting the normal switching signal.

12. A column redundancy circuit for a semiconductor memory, comprising:
    a memory array including a plurality of array units respectively having a plurality of normal memory cells and a plurality of redundancy memory cells, each array unit outputting a normal data stored in the normal memory cell, and outputting a redundancy data stored in the redundancy memory cell;
    a first main amplifier for amplifying the redundancy data;
    a second main amplifier for amplifying the normal data;
    a column redundancy unit for outputting a redundancy enable signal according to a column address, a row address and a fuse short state; and
    a switch unit for selecting and outputting one of the redundancy data amplified in the first main amplifier and the normal data amplified in the second main amplifier according to a logical state of the redundancy enable signal.

13. The column redundancy circuit according to claim 12, further comprising:
    a pulse width control unit for outputting an internal clock signal in order to control a pulse width of a column selecting signal according to a buffered external clock signal; and
    a column decoder for receiving a predecoded column address and an internal clock signal, and for outputting a normal column selecting signal and a redundancy column selecting signal.

14. The column redundancy circuit according to claim 12, wherein the memory array comprises:
    a plurality of local normal input/output lines being connected to the normal memory cells;
    a plurality of local redundancy input/output lines being connected to the redundancy memory cells;
    a global redundancy input/output line for connecting the plurality of local redundancy input/output lines to the first main amplifier; and
    a global normal input/output line for connecting the plurality of local normal input/output lines to the second main amplifier.

15. The column redundancy circuit according to claim 12, wherein the column redundancy unit comprises:
    a plurality of enable units for respectively outputting a column address true signal or a column address bar signal according to the row address and fuse state; and
    a combination unit for combining signals outputted from the plurality of enable units, and for outputting the redundancy enable signal.

16. The column redundancy circuit according to claim 15, wherein the number of the plurality of enable units is identical to the number of the column addresses.

17. The column redundancy circuit according to claim 15, wherein the plurality of enable units each respectively comprise:
    a switching transistor being switched according to the row address;
    a first transmission gate for outputting the column address true signal according to an ON/OFF state of the switching transistor; and
    a second transmission gate for outputting the column address bar signal according to the ON/OFF state of the switching transistor, the first and second transmission gates having a complementary relationship.

18. The column redundancy circuit according to claim 15, wherein the plurality of enable units each respectively comprise:
    a switching transistor being switched according to the row address;
    a NAND gate having one side input terminal connected to a read/write enable signal, and having the other side input terminal connected to the switching transistor via the fuse;

a first transmission gate being switched according to a logical level of the other side input terminal and the output terminal of the NAND gate, and outputting the column address true signal; and a second transmission gate being switched according to a logical level of the other side input terminal and the output terminal of the NAND gate, and outputting the column address bar signal, the first and second transmission gates having a complementary relationship.

19. The column redundancy circuit according to claim 15, wherein the combination unit outputs the redundancy enable signal at a high level when the signals outputted from the plurality of enable units are all at a high level.

20. The column redundancy circuit according to claim 15, wherein the combination unit comprises:

a plurality of NAND gates for NANDing signals outputted from the plurality of enable units;

a NOR gate for NORing outputs from the plurality of NAND gates; and two inverters for buffering an output from the NOR gate, and for outputting the redundancy enable signal.

21. The column redundancy circuit according to claim 12, wherein the switch unit comprises:

a buffer unit for receiving the redundancy enable signal, and for outputting the redundancy switching signal and the normal switching signal;

a redundancy switch being switched according to the redundancy switching signal, and outputting the redundancy data from the first main amplifier; and a normal switch being switched according to the normal switching signal, and outputting the normal data from the second main amplifier, a logical level of the redundancy switching signal being opposite to a logical level of the normal switching signal.

22. The column redundancy circuit according to claim 21, wherein the buffer unit comprises:

a NAND gate for NANDing the redundancy enable signal and the read/write enable signal;

first and second inverters for buffering an output from the NAND gate, and for outputting the redundancy switching signal;

a third inverter for inverting the read/write enable signal;

a NOR gate for NORing an output from the third inverter and the redundancy enable signal; and a fourth inverter for inverting an output from the NOR gate, and for outputting the normal switching signal.

\* \* \* \* \*

UNITED STATES PATENT AND TRADEMARK OFFICE
CERTIFICATE OF CORRECTION

PATENT NO. : 6,172,921 B1
DATED : January 9, 2001
INVENTOR(S) : San Ha PARK et al.

It is certified that error appears in the above-identified patent and that said Letters Patent is hereby corrected as shown below:

Please insert category "[73] Assignee:" as follows:

--[73] Assignee" Hyundai Electronics Industries Co., Ltd., Kyoungki-do, Korea--

Signed and Sealed this

Fifth Day of June, 2001

*Attest:*

NICHOLAS P. GODICI

*Attesting Officer*

*Acting Director of the United States Patent and Trademark Office*

UNITED STATES PATENT AND TRADEMARK OFFICE
CERTIFICATE OF CORRECTION

PATENT NO. : 6,172,921 B1
DATED : January 9, 2001
INVENTOR(S) : San Ha Park et al.

Page 1 of 1

It is certified that error appears in the above-identified patent and that said Letters Patent is hereby corrected as shown below:

Please insert category "[73] Assignee:" as follows:

-- [73] Assignee" Hyundai Electronics Industries Co., Ltd., Kyoungki-do, Korea --

Signed and Sealed this

Twenty-fourth Day of July, 2001

Attest:

*Attesting Officer*

NICHOLAS P. GODICI
*Acting Director of the United States Patent and Trademark Office*